ELECTRICAL TERMINAL HOUSING HAVING HINGE AND ADJACENT LOCK PROJECTION

Original Filed March 12, 1969

ELDON P. HOFFMAN
INVENTOR

BY
BUCKHORN, BLORE, KLARQUIST & SPARKMAN
ATTORNEYS

United States Patent Office

Re. 28,147
Reissued Sept. 3, 1974

28,147

ELECTRICAL TERMINAL HOUSING HAVING HINGE AND ADJACENT LOCK PROJECTION

Eldon P. Hoffman, Portland, Oreg., assignor to Tektronix, Inc., Beaverton, Oreg.

Original No. 3,582,863, dated June 1, 1971, Ser. No. 806,432, Mar. 12, 1969. Application for reissue Mar. 19, 1973, Ser. No. 342,902
Int. Cl. H01r *11/02;* H05k *1/04*
U.S. Cl. 339—59 M 19 Claims

Matter enclosed in heavy brackets [ ] appears in the original patent but forms no part of this reissue specification; matter printed in italics indicates the additions made by reissue.

ABSTRACT OF THE DISCLOSURE

An electrical terminal housing is described which includes a first end portion having a row of chambers containing the connector terminals connected by a hinge portion to a second end portion having a row of slots releasably holding the connectors so that a locking projection thereon extends into notches formed in the connectors in one position of the hinge to prevent removal of the connector terminals from such chambers. In another position of the hinge, the lock projection disengages from the connector notches and such connectors are released from the slots to enable removal of the connector terminals from such chambers. The entire terminal housing may be molded as a single piece of polypropylene plastic including a flexible hinge of reduced thickness.

BACKGROUND OF INVENTION

The subject matter of the present invention relates generally to electrical terminal apparatus for holding electrical connectors in closely spaced, insulated relationship and in particular to a terminal housing having connector receiving chambers formed therein together with a locking projection extending across the paths of connectors to engage notches in the connectors and lock them in such chambers in the locked position of a hinge portion provided between the locking projection and such chambers. The terminal housing member of the present invention also includes a row of gripping slots in alignment with the connector receiving chambers to releasably hold such connectors in the locked position of the hinge and to release such connectors when the hinge is rotated to an unlocked position in which the locking projection is removed from the connector notches to enable their removal from such chambers. The terminal housing of the present invention may be molded as a single piece of flexible plastic material, such as polypropylene.

The present invention is particularly useful as an inexpensive, compact terminal housing for supporting small electrical connectors close together in spaced, insulated relationship. The connectors may have receptacle terminals which are plugged into pin conductors attached to an etched circuit board for making connection to the conductor strips on such board.

Previous terminal housings have been in the form of rigid plastic blocks and a separate locking rod of very small diameter which is inserted into a hole provided through such block for locking the connectors therein. The locking rod must be removed from the block to permit unlocking of the connectors. This has the disadvantage that the separate locking rod may easily be lost or broken. Terminal housings of flexible plastic material have been employed which have metal soldering tabs provided thereon whose other ends form connector terminals permanently secured to the housing, as shown in U.S. Pat. No. 3,188,604 of F. T. Mogestad et al. As a result, these prior-art terminal housings are extremely inconvenient when it is desired to change connections, since the wires must be unsoldered from the tab ends of the connector terminals forming a permanent part of such housing. In addition, other housings of rigid plastic have previously been provided with lock projections formed integrally therewith, as shown in U.S. Pat. No. 3,277,425 of J. Marshall et al. However, these other housings are not provided with a flexible hinge to enable disengagement of the lock, but rather a flexible connector portion which requires the use of a special tool for disengaging the lock from the connector.

All of these disadvantages are overcome by the terminal housing of the present invention which employs a locking projection and a hinge adjacent such locking projection to enable disengagement of such locking projection from notches in the connector terminals so that such connector terminals may be removed from the housing. Thus the terminal housing of the present invention is provided with a simple, compact and inexpensive construction which enables electrical connectors to be more easily assembled and locked in the housing as well as to be unlocked and disassembled from such housing. Furthermore, the housing may be molded from one piece of plastic, thereby greatly reducing its cost and enabling the connectors to be releasably mounted thereon without soldering.

It is therefore one object of the present invention to provide an improved electrical terminal apparatus of simple and compact construction including a terminal housing in which electrical connectors are releasably mounted and locked in one position of the housing to prevent longitudinal movement of such connectors.

Another object of the invention is to provide an improved terminal housing of electrical insulating material including a locking projection formed integrally therewith adjacent to a hinge which upon pivoting causes the locking projection to engage and disengage with electrical connectors mounted in such housing to lock and unlock such connectors in a quick and easy manner.

A further object of the present invention is to provide an improved terminal housing of simple and inexpensive construction which is molded from a single piece of plastic material with a flexible hinge and a locking projection formed integrally therewith.

An additional object of the invention is to provide an improved terminal housing including one end portion having a row of gripping slots in alignment with a row of chambers formed in another end portion in order to releasably grip electrical connectors in such slots so that the terminal ends of such connectors are positioned in such chambers to accurately support such connectors in compact, spaced, insulated relationship.

BRIEF DESCRIPTION OF DRAWINGS

Other objects and advantages of the present invention will be apparent from the following detailed description of certain preferred embodiments thereof, as shown in the attached drawings of which.

DESCRIPTION OF PREFERRED EMBODIMENTS

Figure 1:
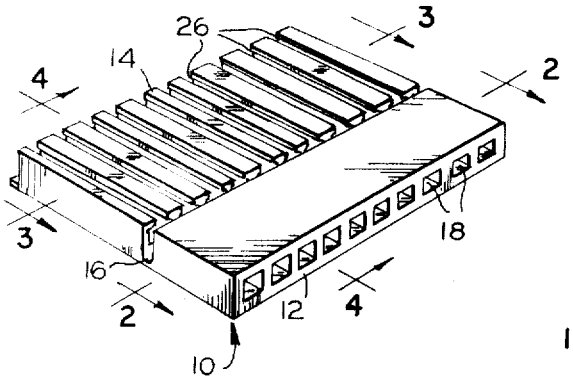
FIG. 1 is a perspective view of one embodiment of the terminal housing of the present invention having a single hinge portion.
Figure 2:
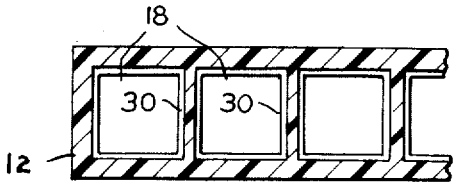
FIG. 2 is a partial section view taken along the line 2—2 of FIG. 1 shown on an enlarged scale.
Figure 3:
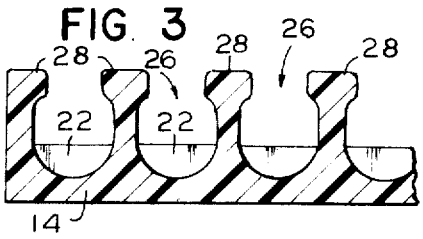
FIG. 3 is a partial section view taken along the line 3—3 of FIG. 1 shown on an enlarged scale.
Figure 4:
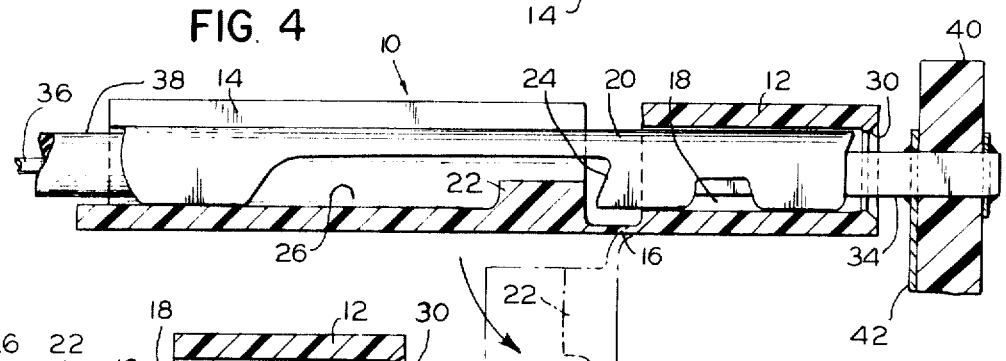
FIG. 4 is an enlarged section view taken along the line 4—4 of FIG. 1, also showing an electrical connector mounted within the terminal housing and showing the unlocked position of the housing in phantom lines.

As shown in FIGS. 1 to 4, one embodiment of the present invention includes a terminal housing 10 of electrical insulating material including a first end portion 12 joined to a second end portion 14 by a flexible hinge portion 16 of reduced thickness. The first end portion 12 includes a plurality of chambers 18 arranged in a row which contain the terminal ends of electrical connectors 20, as shown in FIG. 4. The connectors are locked against longitudinal movement by a locking projection 22 formed integral with the first end portion adjacent hinge portion 16 so that such locking projection engages a shoulder 24 at the right of a crimped intermediate portion of such connector in the locked position of the hinge shown in solid lines in FIG. 4.

The second end portion 14 of the terminal housing includes a plurality of gripping slots 26 which are positioned in a row so that each of such slots is in alignment with a different one of chambers 18. As shown in FIGS. 3 and 4, the locking projection 22 projects upwardly from the bottom of the right-hand ends of slots 26 and extends along the row of chambers 18 so that such projection is positioned in the path of the connectors 20 extending between such chambers and such slots. Thus the locking projection 22 engages the shoulders 24 on each of the connectors 20 and prevents removal of the connectors from the chambers 18 when the housing is in the locked position shown in solid lines in FIG. 4. However in the unlocked position of hinge 16 shown in phantom lines in FIG. 4, the locking projection 22 is rotated out of the crimped indentation in the connectors 20 so that such projection no longer engages shoulder 24 and the connectors may be moved longitudinally out of chambers 18 to enable insertion or removal of such connectors.

The terminal housing 10 is attached to the electrical connectors 20 by gripping slots 26 to hold the locking projection 22 in the locked position shown in FIG. 4. The slots 26 are separated by resilient gripping ridges 28 having enlarged top portions which extend partially over the tops of the slots at the opposite sides thereof. The ridges 28 releasably engage the connectors 20 and hold such connectors within slots 26. The slots 26 are provided with an arcuate bottom portion which conforms to the left end of the connectors 20, so that such connectors are tightly held in position within such slots.

The chambers 18 in the first end portion 12 of the terminal housing, have a rectangular cross section with openings at the opposite ends thereof including a restricted opening at the right end of the chambers. The restricted opening is formed by an inwardly projecting flange 30 surrounding such opening which acts as a stop for the connector 20 by engagement with the right end of the connector terminal. Thus stop flange 30 prevents longitudinal movement of the connector terminal to the right within the housing 10, while locking projection 22 prevents longitudinal movement of such connector to the left when the hinge 16 is in the locked position shown in solid lines.

The terminal housing 10 is preferably molded as one piece of flexible plastic material, such as polypropylene, so that the first end portion 12, the second end portion 14 and the hinge portion 16 are all formed integral with each other. However it is also possible to make the first end portion and the second end portion of the housing out of two separate plastic members joined by a metal hinge member. Furthermore it is also possible by using different connectors 20 with special gripping notches to have the locking projection 22 releasably hold the connector by engagement in such notch, in which case slots 26 and gripping ridges 28 may be eliminated.

Figure 5:
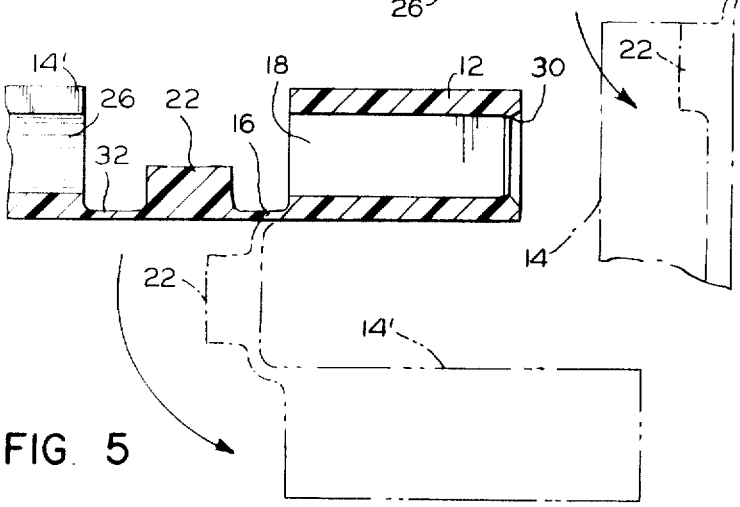
FIG. 5 is a section view similar to FIG. 4, of a portion of another embodiment of the terminal housing of the present invention having a second hinge portion.

As shown in FIG. 5, another embodiment of the terminal housing includes a second hinge portion 32 connecting the second end portion 14' to the stop projection 22. The stop projection is in the form of a rectangular bar and is positioned outside of slots 26. The hinge portions 16 and 32 are formed of reduced thickness plastic material on opposite sides of the stop projection to facilitate bending of such end portions to enable the second end portion 14' to pivot into the unlocked position shown by phantom lines in FIG. 5. This two hinge terminal housing enables easier unlocking for removal of the connectors.

The terminals of electrical connectors 20 may be in the form of receptacles having rectangular cavities into which conductor pins 34 of rectangular cross section are inserted through the restricted openings 30 into the right end of the chambers 18. The other ends of connectors 20 are connected to a conductor wire 36 having an insulating coating 38 thereon. This connection may be formed by crimping the connector onto the bare end of the wire, thereby forming the crimped recess in such connector bounded by one end by shoulder 24 and into which the locking projection 22 extends. The conductor pins 34 may be attached to an etched circuit board 40, as shown in FIG. 4. Thus the metal pins 34 are inserted through apertures in the insulator sheet of the circuit board and are soldered to one of a plurality of conducting strips 42 of copper or other suitable metal forming an electrical circuit on the surface of such board in a conventional manner. In this manner a plurality of connector terminal housings can be connected to the etched circuit board in a very small area at any position on such board, rather than using only a single connector socket at the edge of such circuit board.

Of course it is also possible to employ pins rather than receptacles for the terminal ends of connectors 20 and provide external receptacles in place of pins 34. In this case the terminal pins of the connectors would extend out through the restricted opening and the stop flange 30 surrounding such opening can engage a shoulder on such pin. Thus the present terminal housing may be employed with many different types of electrical connectors.

It will be obvious to those having ordinary skill in the art that many changes may be made in the details of the above-described preferred embodiments of the present invention without departing from the spirit of the invention. Therefore the scope of the invention should only be determined by the following claims:

I claim:

1. Electrical terminal apparatus for holding electrical connectors, comprising:

a terminal housing including a first end portion and a second end portion connected to the first end portion by a hinge portion;

said first end portion having a plurality of open ended chambers formed therein for supporting a plurality of electrical connectors in spaced insulated relationship;

and a releasable lock means fixedly attached to said second end portion adjacent said hinge portion for preventing longitudinal movement of the connector terminals out of said chambers by engagement with said connectors in one position of said hinge portion, and for enabling removal of the connector terminals from said chambers by disengagement of said lock means from the connectors in response to the pivoting of said hinge portion into another position.

2. Terminal apparatus in accordance with claim 1 in which the lock means includes a locking projection formed in an intermediate portion of said housing so that it projects into the path of at least one of the connectors to prevent said one connector from being removed from its chamber when the hinge portion is in said first position, said locking projection being moved out of said path to enable removal of said one connector from its chamber in another position of said hinge when the hinge is pivoted about an axis extending laterally across said chambers.

3. Terminal apparatus in accordance with claim 2 in which the chambers are positioned in a row and the locking projection extends along said row of chambers and projects into the path of each connector within said chambers.

4. Terminal apparatus in accordance with claim 2 in which said second end portion has a releasable gripping means on the opposite side of the locking projection from said chambers, said gripping means having means for gripping the electrical connectors so that their connection terminals are positioned within said chambers in said one position of said hinge portion, and for releasing said connector in the other position of said hinge portion.

5. Terminal apparatus in accordance with claim 4 in which the gripping means includes a row of slots formed in the second end portion with each slot being in alignment with the end of a different one of said chambers in said one position of the hinge portion, said slots having restricted top openings formed between resilient grip portions extending along said slots between adjacent slots which releasably hold said connectors in said slots.

6. Terminal apparatus in accordance with claim 2 which also includes another hinge portion spaced from the first-mentioned hinge portion and connecting the second end portion to the intermediate portion.

7. Terminal apparatus in accordance with claim 1 in which the terminal housing is a single member of plastic material with the first and second end portions, the lock means and the hinge portion being formed integrally in said member.

8. Terminal apparatus in accordance with claim 7 in which the hinge portions are of sufficiently reduced thickness for easy bending to provide flexible hinge portions.

9. Terminal apparatus in accordance with claim 5 in which the chambers are each provided with a restricted opening at one end thereof having a stop portion adjacent said restricted opening which engages the terminal end of the connector to prevent it from passing through said restricted opening.

10. Terminal apparatus in accordance with claim 9 having a plurality of electrical connectors mounted therein, said connectors having terminal ends within said chambers and their other ends positioned in said slots so that wires connected to said other ends extend out one end of the slots and the connectors extend out the other end of the slots and a crimped intermediate contact portion of reduced thickness is positioned to be engaged by the locking projection.

11. Terminal apparatus in accordance with claim 10 in which the terminal ends of the connectors have receptacles for receiving conductor pins inserted through said restricted openings of said chambers into said receptacles.

12. Terminal apparatus in accordance with claim 11 in which the conductor pins are attached to an etched circuit board.

13. A housing for housing connector members having connector-engaging sections and wire-engaging sections, comprising:

a first portion having a plurality of open-ended chambers in which the connector-engaging sections are to be disposed;

a second portion having openings extending along paths to corresponding ones of said chambers and in which the wire-engaging sections are to be disposed;

hinge means extending between said first and second portions for permitting said second portion to be moved to a first position relative to said first portion so that the connector-engaging sections of the connector members can be positioned in said chambers and to be moved to a second position at which the wire-engaging sections are positioned in said openings; and retaining means provided by said housing and disposed in the path of each of said chambers and openings for retaining the connector members in position in said chambers and said openings when said second portion is in said second position.

14. A housing as claimed in claim 13 wherein said retaining means in each path is part of said second portion adjacent said hinge means.

15. A housing as claimed in claim 13 wherein said retaining means in each path is part of said hinge means.

16. A housing as claimed in claim 13 wherein said openings extend from one end of said second portion to the other and communicate with slots in one surface of said second portion through which the wire-engaging sections are passed into said openings, said slots defining gripping ridges to maintain the wire-engaging sections in said openings.

*17. A housing for housing connector means having connector-engaging means and conductor-engaging means comprising:*

*first portion means having open-ended chamber means for receiving the connector-engaging means;*

*second portion means having opening means extending in alignment with said chamber means for receiving the conductor-engaging means therein;*

*means extending between said first and second portion means connecting said first and second portion means together;*

*retaining mean provided by said second portion means and defining slot means in communication with said opening means through which the conductor-engaging means are moved into said opening means, said slot means having gripping ridges to maintain the conductor-engaging means in position in said opening means; and*

*means in said open-ended chamber means and adjacent said opening means for limiting longitudinal movement of the connector means in said housing.*

*18. A housing as claimed in claim 17 wherein said open-ended chamber means and said opening means in alignment therewith comprise a plurality thereof.*

*19. A housing as claimed in claim 17 wherein said means adjacent said opening means for limiting longitudinal movement of the connector means in said housing is disposed on said means connectig said first ad second portion means together.*

References Cited

The following references, cited by the Examiner, are of record in the patented file of this patent or the original patent.

UNITED STATES PATENTS

| | | | |
|---|---|---|---|
| 2,809,361 | 10/1957 | Woofter et al | 339—59 M X |
| 3,087,137 | 4/1963 | Linn | 339—217 X |
| 3,159,447 | 12/1964 | Crimmins et al. | 339—17 F X |
| 3,253,246 | 5/1966 | McConnell et al. | 339—17 L M |
| 3,188,604 | 6/1965 | Mogestad et al. | 339—59 M X |
| 3,530,424 | 9/1970 | Gregory | 339—91 R |
| 3,430,185 | 2/1969 | Sitzler et al. | 339—59 M |

FOREIGN PATENTS

| | | | |
|---|---|---|---|
| 1,070,926 | 6/1967 | Great Britain | 339—59 M |

BOBBY R. GAY, Primary Examiner

T. P. LEWIS, Assistant Examiner

U.S. Cl. X.R.

339—17, 217